(12) United States Patent
Kuwazawa

(10) Patent No.: US 7,352,028 B2
(45) Date of Patent: Apr. 1, 2008

(54) SOLID-STATE IMAGING DEVICES

(75) Inventor: Kazunobu Kuwazawa, Chino (JP)

(73) Assignee: Seiko Epson Corporation (JP)

( * ) Notice: Subject to any disclaimer, the term of this patent is extended or adjusted under 35 U.S.C. 154(b) by 96 days.

(21) Appl. No.: 11/230,268

(22) Filed: Sep. 19, 2005

(65) Prior Publication Data

US 2006/0065915 A1 Mar. 30, 2006

(30) Foreign Application Priority Data

Sep. 27, 2004 (JP) .............................. 2004-278986

(51) Int. Cl.
 *H01L 29/788* (2006.01)
(52) U.S. Cl. ...................... 257/323; 257/230; 257/233; 257/234
(58) Field of Classification Search ................. 257/323, 257/230, 233, 234
See application file for complete search history.

(56) References Cited

U.S. PATENT DOCUMENTS

2005/0030399 A1* 2/2005 Suzuki et al. ............... 348/294

FOREIGN PATENT DOCUMENTS

| JP | 58-042370 | 3/1983 |
| JP | 63-073659 | 4/1988 |
| JP | 06-089997 | 3/1994 |
| JP | 2002-368201 | 12/2002 |

* cited by examiner

*Primary Examiner*—Long Pham
(74) *Attorney, Agent, or Firm*—Harness, Dickey & Pierce, P.L.C.

(57) ABSTRACT

A solid-state imaging device includes: a substrate; a photoelectric transducer that is provided within the substrate and generates light-generated charge in accordance with incident light; a floating diffusion that retains the light-generated charge generated from the photoelectric transducer; a transfer and retention unit that is provided between the photoelectric transducer and the floating diffusion for a purpose of controlling a transfer of the light-generated charge and has a charge-retaining region that can retain the light-generated charge generated from the photoelectric transducer; a reset unit that initializes a potential of the floating diffusion; an amplifying transistor that generates an output based on a potential of the floating diffusion; a selection transistor that selectively outputs an output of the amplifying transistor; and an excessive charge-discharging unit that discharges excessive electric charge generated from the photoelectric transducer.

2 Claims, 6 Drawing Sheets

SOLID-STATE IMAGING DEVICES

BACKGROUND OF THE INVENTION

1. Technical Field

The present invention relates to solid-state imaging devices having high image quality and low power consumption.

2. Related Art

As solid-state imaging devices mounted in cellular phones, digital cameras, etc., there are a charge-coupled device (CCD) image sensor (hereinafter called a CCD sensor) and a CMOS image sensor (hereinafter called a CMOS sensor).

A CCD sensor achieves a correlation double sampling (CDS) function for removing noises and a so-called global electronic shutter function for shooting images of rapidly moving objects without distortion. The global electronic shutter function is a function for eliminating the distortion of images of moving objects by storing light-generated charge at a time for a number of light-receiving elements that are placed two-dimensionally. Therefore, a CCD sensor generally has an advantage of excellent image quality. At the same time, however, a CCD sensor has disadvantages of high driving voltage and high power consumption.

On the other hand, a CMOS sensor generally has an advantage that the process cost is low with low power consumption due to low driving voltage. However, a general CMOS sensor cannot achieve both of the global electronic shutter function and the CDS function at the same time.

For example, in a CMOS sensor of CMOS-active pixel sensor (APS) type having a four-transistor configuration, a noise component is read out first by resetting a floating diffusion, which serves as a charge-retaining region, for each reading line and then a signal component is read out, which is the CDS function. That is, in the CDS function, since signal read-out is performed immediately after noise read-out, light-generated charge generated by a photodiode is transferred to the floating diffusion via a transfer transistor immediately after noise read-out. Since read-out is performed line by line, the transfer of light-generated charge to the floating diffusion is also performed line by line. Therefore, the storage period differs line by line.

In addition, there is another driving method that employs the global electronic shutter in which the light-generated charge of all pixels is stored at a time using photodiodes and transferred at a time to floating diffusions via transfer transistors. In this case, however, light-generated charge is stored in the floating diffusions of all lines. Therefore, signal read-out needs to be performed before noise read-out. In other words, the device needs to be driven in the order of signal read-out, reset, and noise read-out for each line. Such a method may slightly degrade image quality because there is no correlation between the noise included in the signal that is read out and the noise that is generated in noise read-out. Also in this case, there is another method that the noises of all pixels are read out before transfer, which, however, requires a frame memory for retaining the noises that are read out.

As a solution to the above disadvantages, there is an example of related art, which will be described later, that discloses a technique to concurrently start/end the signal-storing operation of all pixels. In the related art example, a charge-retaining region is provided directly under a transfer gate. Thus, signal charge generated from a photodiode is temporarily stored in the charge-retaining region and then transferred to a floating diffusion. By this method, the global electronic shutter function is achieved.

Japanese Unexamined Patent Publication No. 2002-368201 is an example of related art.

By the way, if an extremely intense light enters into a photodiode, the generated amount of light-generated charge increases and may cause overflow from the photodiode. Such overflow charge (hereinafter also called excessive charge) flows from a photodiode-forming region into a floating diffusion via a transfer transistor so as to be discharged when the floating diffusion is reset.

In the proposal of Japanese Unexamined Patent Publication No. 2002-369201, however, the excessive charge from the photodiode is stored in the charge-retaining region provided directly under the transfer gate. This means that the light-generated charge of the subsequent frame flows into the charge-retaining region, which induces a degradation of image quality.

SUMMARY

An advantage of the invention is to provide solid-state imaging devices that can improve image quality by discharging excessive electric charge.

According to a first aspect of the invention, a solid-state imaging device includes: a substrate; a photoelectric transducer that is provided within the substrate and generates light-generated charge in accordance with incident light; a floating diffusion that retains the light-generated charge generated from the photoelectric transducer; a transfer and retention unit that is provided between the photoelectric transducer and the floating diffusion for the purpose of controlling the transfer of the light-generated charge and has a charge-retaining region that can retain the light-generated charge generated from the photoelectric transducer; a reset unit that initializes a potential of the floating diffusion; an amplifying transistor that generates an output based on a potential of the floating diffusion; a selection transistor that selectively outputs an output of the amplifying transistor; and an excessive charge-discharging unit that discharges excessive electric charge generated from the photoelectric transducer.

In the above configuration, the photoelectric transducer generates light-generated charge in accordance with incident light. The light-generated charge generated from the photoelectric transducer is transferred to and retained in the floating diffusion after being retained temporarily in the transfer and retention unit. Then, an output in accordance with the variation in potential of the floating diffusion can be obtained from the amplifying transistor. Not only by transferring the light-generated charge of all pixels at a time to the transfer and retention unit but also by transferring the light-generated charge to the floating diffusion after reading out a noise component following the reset operation at the time of read-out of each line, higher image quality can be achieved. In addition, since the excessive electric charge generated in the photoelectric transducer is discharged by the excessive charge-discharging unit, the excessive electric charge from the photoelectric transducer never flows into the transfer and retention unit during any period other than the transfer period. By this method, even if an extremely intense light enters, the degradation of image quality can be prevented.

Further, the excessive charge-discharging unit may include: a first impurity region that is formed on the surface of the substrate and coupled to a fixed potential point; and a third impurity region, which is formed on the surface of the substrate, contacting with a second impurity region configuring the photoelectric transducer and the first impurity region.

In the above configuration, the light-generated charge generated in the photoelectric transducer is collected into the second impurity region. The excessive electric charge overflowed from the second impurity region flows into the first impurity region via the third impurity region and discharged.

Further, according to a second aspect of the invention, another solid-state imaging device includes: a substrate; a photoelectric transducer that is provided within the substrate and generates light-generated charge in accordance with incident light; a floating diffusion that retains the light-generated charge generated from the photoelectric transducer; a transfer and retention unit that is provided between the photoelectric transducer and the floating diffusion for the purpose of controlling the transfer of the light-generated charge and has a charge-retaining region that can retain the light-generated charge generated from the photoelectric transducer; a reset unit that initializes a potential of the floating diffusion; an amplifying transistor that generates an output based on a potential of the floating diffusion; a selection transistor that selectively outputs an output of the amplifying transistor; and an excessive charge-discharging path that lets excessive electric charge generated from the photoelectric transducer flow into the floating diffusion.

In the above configuration, the photoelectric transducer generates light-generated charge in accordance with incident light. The light-generated charge generated from the photoelectric transducer is transferred to and retained in the floating diffusion after being retained temporarily in the transfer and retention unit. By this method, the transfer and advance noise reading of all pixels can be performed at a time, and therefore higher image quality can be achieved. In addition, the excessive electric charge generated in the photoelectric transducer flows into the floating diffusion via the excessive charge-discharging path and discharged from the floating diffusion at the time of reset. Thanks to the excessive charge-discharging path, the inflow of the excessive electric charge generated from the photoelectric transducer into the transfer and retention unit can be prevented. Thus, even if an extremely intense light enters, the degradation of image quality can be prevented.

Further, the excessive charge-discharging path may be configured of a fifth impurity region, which is formed on the surface of the substrate, contacting with a second impurity region configuring the photoelectric transducer and a fourth impurity region configuring the floating diffusion.

In the above configuration, the light-generated charge generated in the photoelectric transducer is collected into the second impurity region. The excessive electric charge overflowed from the second impurity region is discharged to the fourth impurity region, which serves as a floating diffusion, via the fifth impurity region. The potential of the floating diffusion is initialized at the time of reset.

According to a third aspect of the invention, yet another solid-state imaging device includes a sensor cell array including matrixed sensor cells, each of which has the photoelectric transducer, the floating diffusion, the transfer and retention unit, the reset unit, the amplifying transistor, the selection transistor, and the excessive charge-discharging path that are provided on the substrate. In the above solid-state imaging device, the excessive charge-discharging path lets excessive electric charge that is generated from the photoelectric transducer flow into the floating diffusion in the same sensor cell.

In the above configuration, the excessive electric charge generated in each of the sensor cells included in the sensor cell array is transferred via the excessive charge-discharging path to the floating diffusion in the same sensor cell. The potential of the floating diffusion is initialized at the time of reset of each line.

According to a fourth aspect of the invention, yet another solid-state imaging device includes a sensor cell array including matrixed sensor cells, each of which has the photoelectric transducer, the floating diffusion, the transfer and retention unit, the reset unit, the amplifying transistor, the selection transistor, and the excessive charge-discharging path that are provided on the substrate. In the above solid-state imaging device, the excessive charge-discharging path lets excessive electric charge that is generated from the photoelectric transducer flow into the floating diffusion in an adjoining sensor cell.

In the above configuration, the excessive electric charge generated in each of the sensor cells included in the sensor cell array is transferred via the excessive charge-discharging path to the floating diffusion in an adjoining sensor cell. The potential of the floating diffusion is initialized at the time of reset of each line.

BRIEF DESCRIPTION OF THE DRAWINGS

The invention will be described with reference to the accompanying drawings, wherein line numbers refer to like elements, and wherein.

DESCRIPTION OF THE EMBODIMENTS

Figure 1:
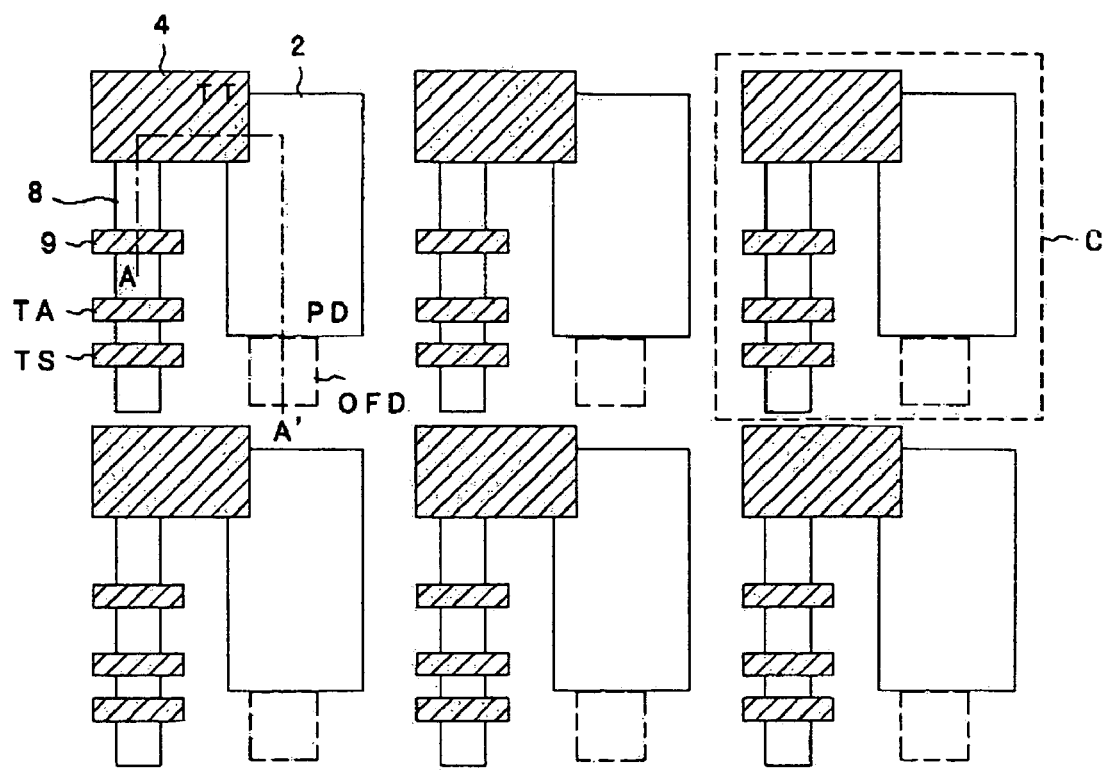
FIG. 1 is a plan view showing the plan-view shape of a solid-state imaging device according to a first embodiment of the invention.
Figure 2:
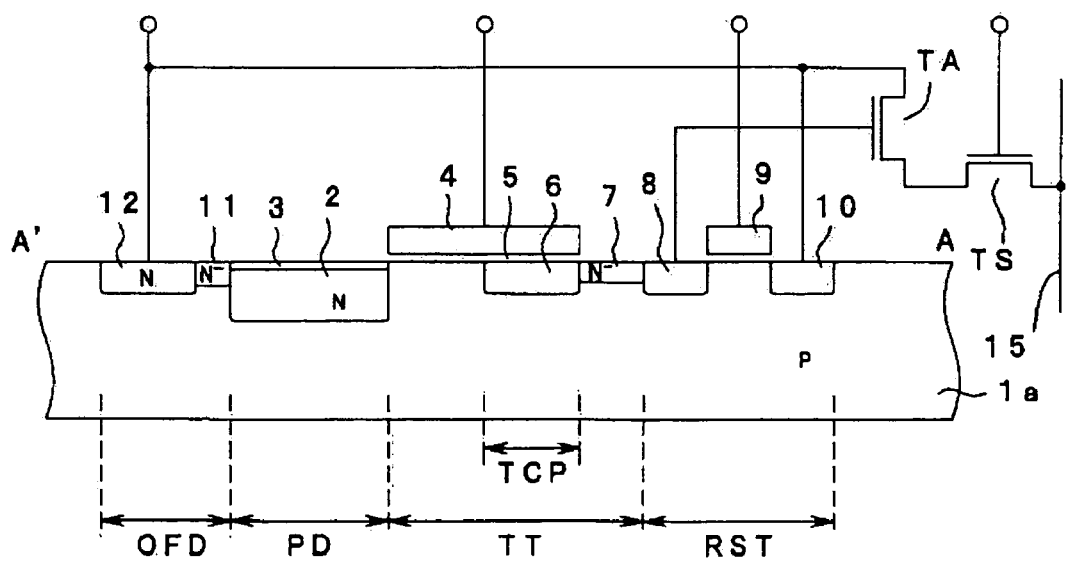
FIG. 2 is an explanatory diagram showing the cross section taken along the line A-A' in FIG. 1.

Embodiments of the invention will now be described in detail with reference to the accompanying drawings. FIG. 1 is a plan view showing the plan-view shape of a solid-state imaging device according to a first embodiment of the invention. FIG. 2 is an explanatory diagram showing the cross section taken along the line A-A' in FIG. 1. However, the cross sections of wiring and upper-layer configurations on the wiring are not illustrated.

The solid-state imaging device according to the first embodiment has, as shown in FIG. 1, a sensor cell array in which a plurality of sensor cells are arranged in a two-dimensional matrix on a substrate plane. In FIG. 1, the region indicated by a dotted line is a sensor cell C, that is, a unit pixel. Each sensor cell stores light-generated charge generated in accordance with incident light and outputs a pixel signal at a level based on the stored light-generated charge. By arranging sensor cells in a matrix, the pixel signal of one screen can be obtained.

The solid-state imaging device according to the first embodiment achieves both of the global electronic shutter function and the CDS function. FIG. 1 only shows six sensor cells. Each of the six sensor cells has a photodiode-forming region PD and has the same configuration. In addition, the first embodiment represents an example of using electrons as light-generated charge. In the case of using positive holes as light-generated charge, the same configuration is also possible.

The solid-state imaging device shown in FIGS. 1 and 2 has the photodiode-forming region PD, a transfer transistor-forming region TT, a reset transistor-forming region RST, an amplifying transistor TA-forming region, and a selection transistor TS-forming region, as well as an overflow drain region OFD for discharging excessive electric charge.

In the reset transistor-forming region RST, a floating diffusion 8 is formed. In the transfer transistor-forming region TT, a charge-retaining region TCP is formed. In the charge-retaining region TCP, an impurity region 6 for temporary retention of transferred light-generated charge is formed.

In the first embodiment, the following series of operation is performed for all pixels, that is, all sensor cells at a time: the light-generated charge stored in each photodiode-forming region PD is transferred to the charge-retaining region TCP of each sensor cell; temporarily retained in the impurity region 6; and transferred from the charge-retaining region TCP to the floating diffusion 8 in the reset transistor-forming region RST for each selection line.

The configuration of the solid-state imaging device according to the first embodiment will be described in more detail with reference to FIGS. 1 and 2. In addition, the signs "−" and "+" subscribed to the "N" and "P" in FIG. 2 and the descriptions of FIG. 2 indicate the concentration of impurities in accordance with the number of signs: the smaller (−−) the thinner; and the larger (++) the thicker.

As shown in FIG. 2, a sensor cell is formed on a P-type substrate 1*a*. On almost all over the P-type substrate 1*a* in the photodiode forming region PD, an N-type impurity layer is formed. The N-type impurity layer functions as a storage well 2, which represents the second impurity region. On the top surface of the substrate in the photodiode-forming region PD, a P-type diffusion layer 3 is formed and electrically coupled to a drain. The diffusion layer 3 also functions as a pinning layer. In the photodiode-forming region PD, an opening is formed on the surface of a substrate 1. The storage well 2 is formed under the opening. In addition, as shown in FIG. 1, the photodiode-forming region PD is formed in a rectangular shape.

Further, on the surface of the P-type substrate 1*a* in the reset transistor-forming region RST, a pair of N-type diffusion layers are formed. Of the pair of N-type diffusion layers, the diffusion layer on the side of the photodiode-forming region PD configures the floating diffusion 8 serving as the fourth impurity region and the other diffusion layer 10 is coupled to a fixed potential point (a white circle in FIG. 2).

On the surface of the substrate in the reset transistor-forming region RST, a reset gate (also called a gate, simply) 9 is formed via a gate insulation film (not illustrated). On the substrate surface under the reset gate 9, a channel is formed.

By applying a specific voltage to the reset gate via a terminal, the channel becomes conductive so as to discharge the electric charge in the floating diffusion 8 via the diffusion layer 10. Thus, the potential of the floating diffusion 8 can be initialized.

Under the opening of the photodiode, there is a depletion layer extending from the boundary between the diffusion layer 3 and the storage well 2 to all over and around the storage well 2. In the depletion region, light-generated charge is generated from the light entered through the opening. Then, the generated light-generated charge is collected into the storage well 2.

The electric charge stored in the storage well 2 is transferred to and retained in the floating diffusion 8 via the transfer transistor-forming region TT, which will be described later. The floating diffusion 8 is coupled to the gate of an amplifying transistor TA. The source of the amplifying transistor TA is coupled to a power supply terminal (a white circle in FIG. 2), and the output of the amplifying transistor TA becomes a value according to the potential of the floating diffusion 8, that is, the incident light into the photodiode-forming region PD that serves as a photodiode.

Now, the transfer transistor-forming region TT will be described. The transfer transistor-forming region TT has, within the substrate, the charge-retaining region TCP for temporarily retaining light-generated charge, as shown in FIG. 2.

Specifically, on the substrate surface, the transfer transistor-forming region TT is formed, on the top surface of the substrate, between the photodiode-forming region PD and the reset transistor-forming region RST in a single sensor cell. The transfer transistor-forming region TT has a transfer gate 4 via a gate insulation film 5 on the substrate surface so that a channel is formed on the substrate surface. Under the transfer gate 4, the charge-retaining region TCP is provided. In the charge-retaining region TCP, the impurity region 6 is formed on the substrate surface. To the transfer gate 4, a transfer pulse is supplied via a terminal.

Between the impurity region 6 and the floating diffusion 8 of the reset transistor-forming region RST, an N⁻ diffusion layer 7 serving as the fifth impurity region is formed. The channel of the transfer transistor-forming region TT, or a transfer path, is controlled by the applied voltage of the transfer gate 4. By this method, the potential barrier of the diffusion layer 7 formed between the impurity region 6 under the transfer gate 4 and the floating diffusion 8 under the reset transistor can be controlled effectively.

As shown in FIG. 1, the transfer gate 4 in the transfer transistor-forming region TT is formed in an approximate rectangular shape, adjoining to the tip of one side of the rectangular photodiode-forming region PD.

In the first embodiment, the overflow drain region OFD for discharging electric charge (excessive charge) overflowed from the photodiode-forming region PD is formed adjoining to the photodiode-forming region PD. In the overflow drain region OFD, an N-type diffusion layer 12 serving as the first impurity region is formed on the substrate surface. The diffusion layer 12 is, together with the diffusion layer 10 in the reset transistor-forming region RST, coupled to a specific fixed potential point (a white circle in FIG. 2).

Between the storage well 2 in the photodiode-forming region PD and the diffusion layer 12, an N⁻ diffusion layer 11 serving as the third impurity region is formed. During a period when the potential barrier in the transfer transistor-forming region TT is set high, the potential barrier generated by the N⁻ diffusion layer 11 is lower than the potential barrier in the transfer transistor-forming region TT. Thus, the N⁻ diffusion layer 11 configures an excessive charge-discharging path (hereinafter also called an OFD path) for transferring the excessive electric charge from the photodiode-forming region PD so as to discharge the excessive electric charge generated in the photodiode-forming region PD to the overflow drain region OFD.

In other words, the N⁻ diffusion layer 11 is formed adjoining to part of one edge of the storage well 2 that does not contact with the transfer transistor-forming region TT. The N⁻ diffusion layer 11 has a lower potential compared to the other edges of the storage well 2. Therefore, the excessive electric charge from the photodiode-forming region PD flows into the overflow drain region OFD, without flowing into the transistor-forming region TT.

Figure 3:
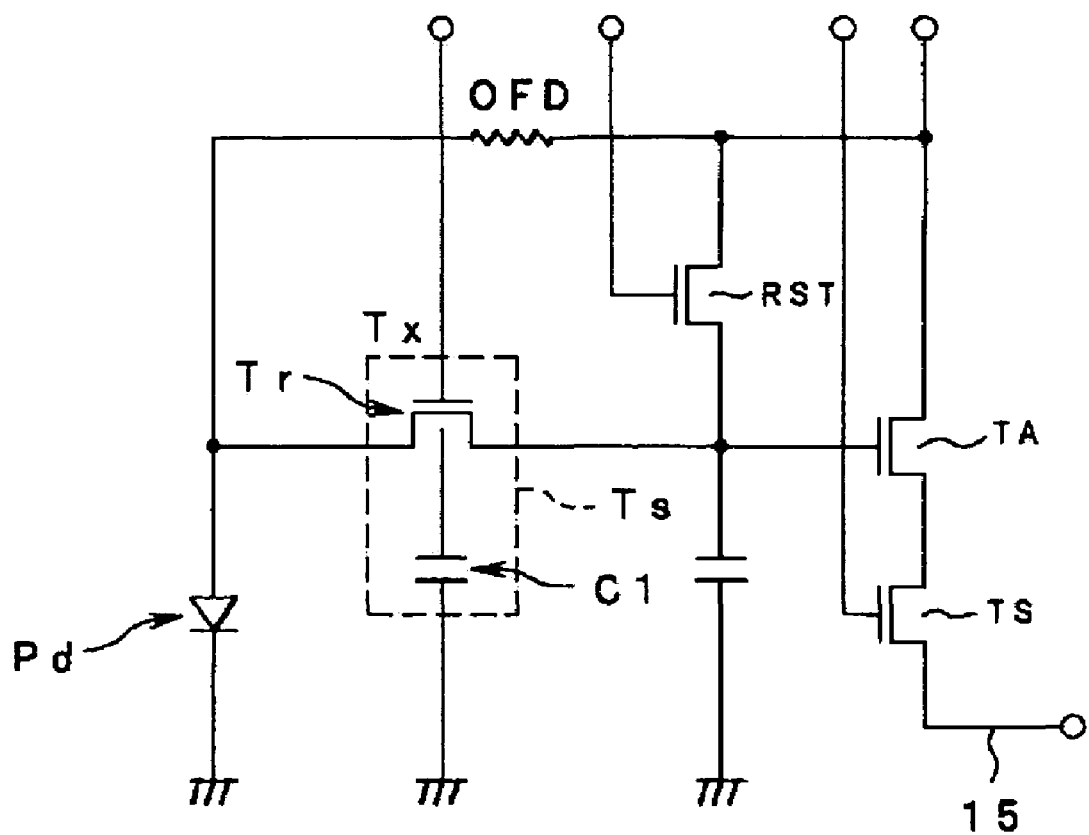
FIG. 3 is a circuit diagram showing an equivalent circuit of a sensor cell in the solid-state imaging device according to the first embodiment.

FIG. 3 is a circuit diagram showing an equivalent circuit of a sensor cell in the solid-state imaging device according to the first embodiment. The sensor cell C has: a photodiode Pd that is achieved in the photodiode-forming region PD; a floating diffusion C2, configuring a capacity, and a reset transistor RST that are achieved in the reset transistor-forming region RST; a transfer and storage unit Ts that is achieved in the transfer transistor-forming region TT including the charge-retaining region TCP; the amplifying transistor TA; and the selection transistor TS. The transfer and storage unit Ts has: a transistor Tr representing a transfer control element formed in the region TT; and a capacity C1 provided under the transistor Tr. The capacity C1 is equivalent to a storage capacity in the impurity region 6 described above.

The electric charge (light-generated charge) generated in the photodiode Pd that conducts photoelectric conversion is temporarily retained in the capacity C1 by controlling the transfer gate 4 of the transistor Tr to be at a specific first voltage. Then, by controlling the transfer gate 4 of the transistor Tr to be at a specific second voltage, the electric charge retained in the capacity C1 is transferred to the floating diffusion 8 of the reset transistor RST.

With the retention of electric charge in the floating diffusion 8, the reset transistor RST changes the gate potential of the amplifying transistor TA to supply an output in accordance with the gate potential based on the amount of electric charge in the floating diffusion 8. By this method, an output voltage VO of the amplifying transistor TA becomes the level corresponding to the potential of the floating diffusion 8, that is, the brightness of the incident light entered into the photodiode Pd. The output of the amplifying transistor TA is outputted to a signal line 15 via the selection transistor TS.

When a specific voltage is applied to the gate of the reset transistor RST, the reset transistor RST becomes conductive and the electric charge stored in the floating diffusion 8 flows to a fixed potential point. Thus, the light-generated charge in the floating diffusion 8 is discharged (initialized) and the potential of the floating diffusion 8 returns to a specific initial value.

Further, in the first embodiment, as shown in FIG. 3, a resistance OFD is coupled to one end of the photodiode Pd. The resistance is equivalent to the N⁻ diffusion layer 11 configuring the OFD path. The other end of the resistance OFD is coupled to a fixed potential point. By this method, the excessive electric charge generated in the photodiode-forming region PD can be discharged via the resistance OFD.

Next, a driving method that achieves the CDS function and the global electronic shutter function in the solid-state imaging device according to the above configurations will be described according to the operation sequence.

Figure 4:
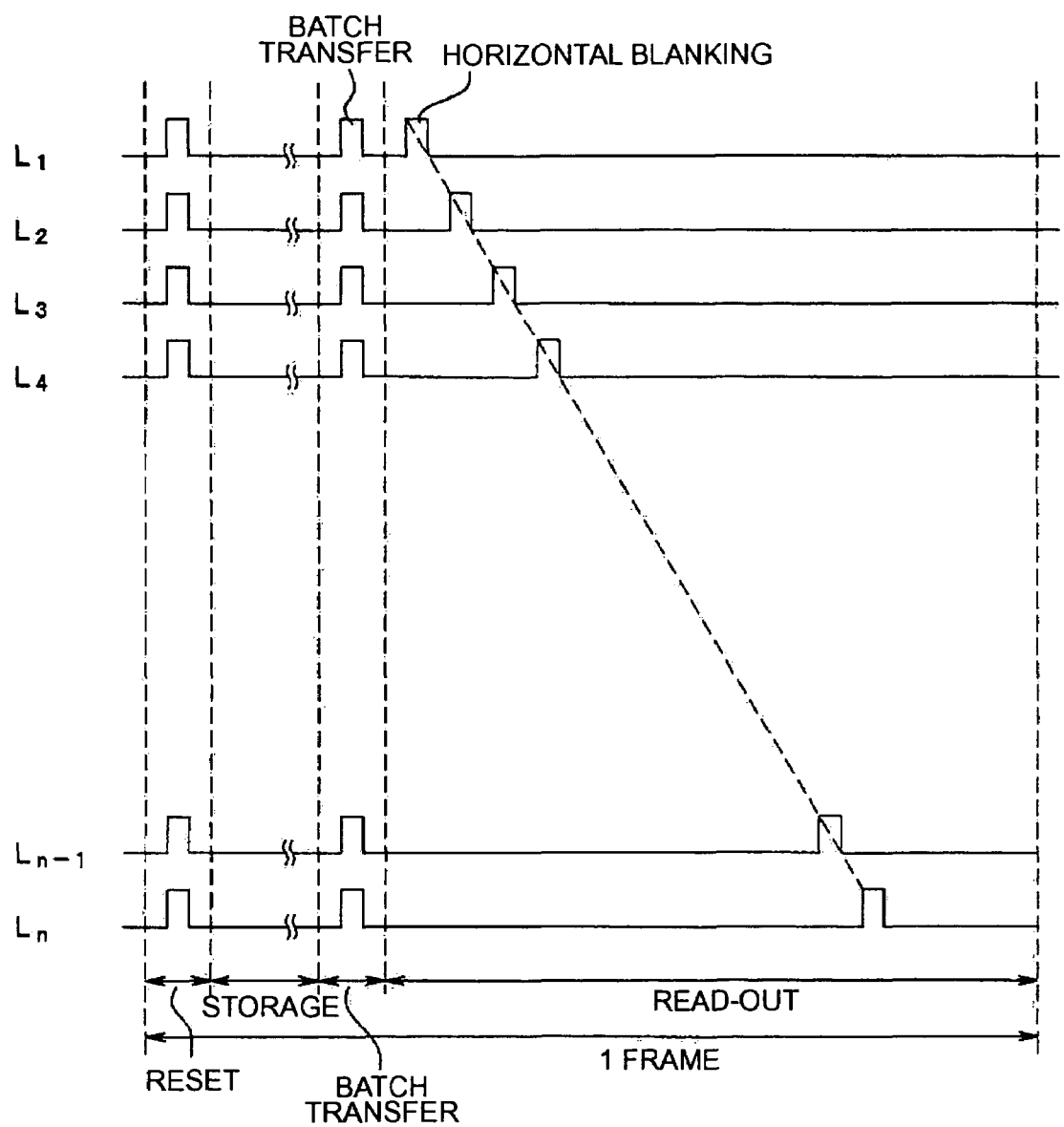
FIG. 4 is a timing chart showing the driving sequence of the solid-state imaging device according to the first embodiment.

FIG. 4 is a timing chart showing the driving sequence of the solid-state imaging device according to the first embodiment. As shown in FIG. 4, a single frame period includes four periods: a reset period, a storage period, a batch transfer period, and a pixel signal read-out period.

The reset period is an all-cell simultaneous reset period for resetting all pixels, that is, all sensor cells at the same time at the start of a frame. Further, the resetting operation performed in the reset period is an operation for discharging the remaining electric charge from the storage well 2, the temporary storage and diffusion region 6, and the floating diffusion 8 of all pixels. After the resetting operation, storing of electric charge into the storage well 2 of each sensor cell is started.

The storage period following the reset period is a period when each sensor cell is in the storage mode for storing, into the storage well 2, the light-generated charge generated in the photodiode-forming region PD at the receipt of light.

The batch transfer period following the storage period is a period when each sensor cell is in the batch transfer mode for transferring the electric charge stored in each photodiode-forming region PD to the charge-retaining region TCP of each sensor cell for all pixels, that is, all sensor cells at a time. The batch transfer operation in the batch transfer period is performed by simultaneously applying a specific first voltage to each transfer gate 4 of the above-described transfer transistor Tr.

With an entrance of an extremely intense light into the photodiode-forming region PD, overflow charge may be generated during the storage period and the batch transfer period. The excessive electric charge from the photodiode-forming region PD is discharged after being transferred to the overflow drain region OFD via the N⁻ diffusion layer 11 configuring the OFD path. In other words, a signal charge (light-generated charge) is retained in the charge-retaining region TCP while the excessive electric charge is discharged via the overflow drain region OFD.

Following the batch transfer mode, the operation mode turns to a state for retaining the electric charge in the charge-retaining region TCP, that is, a retention and noise output mode.

As shown in FIG. 4, the pixel signal read-out period following the batch transfer period includes horizontal blanking periods for transferring the electric charge retained in the charge-retaining region TCP to the floating diffusion of the reset transistor-forming region RST for each selected line. That is, as shown in FIG. 4, in the pixel signal read-out period, horizontal blanking periods occur sequentially, in other words, consecutively with time lags for n lines starting from the first line L1 to the last line Ln. The horizontal blanking period includes a reset period and a noise and signal components read-out period, as shown in FIG. 5.

Figure 5:
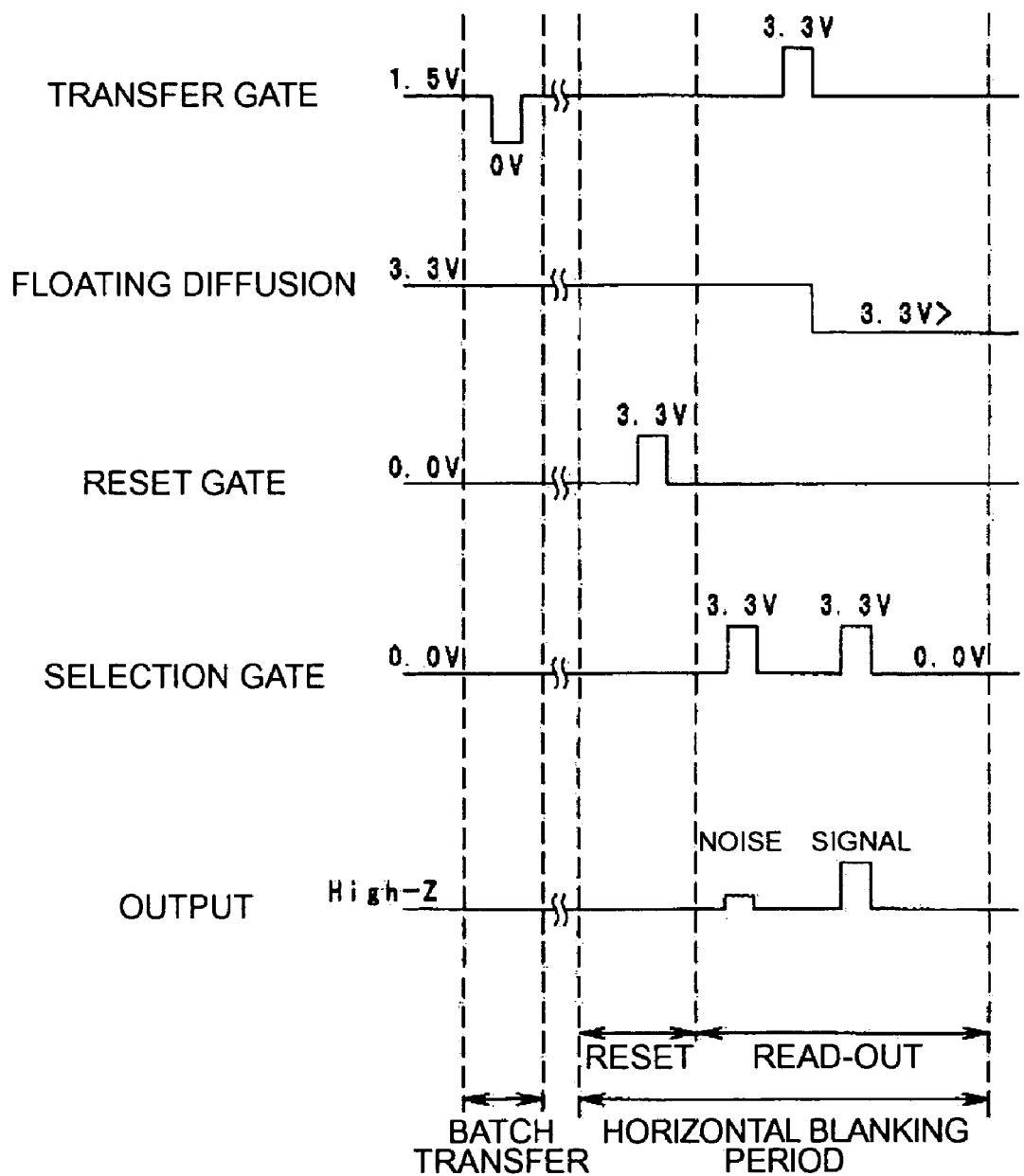
FIG. 5 is another timing chart for describing a batch transfer period and a horizontal blanking period.

FIG. 5 is another timing chart for describing the batch transfer period and the horizontal blanking period. FIG. 5 shows the voltage waveforms and outputs of the transfer gate 4 of the transistor Tr, the floating diffusion 8, the reset gate 9 of the reset transistor RST, and the gate of the selection transistor TS in the batch transfer period and the horizontal blanking period.

In the batch transfer period, the voltage of the transfer gate 4 changes from 1.5 V to 0 V; the voltage of the reset gate 9 is 0.0 V; and the voltage of the selection gate is 1.0 V. No light-generated charge is transferred to the floating diffusion 8 and the potential of the floating diffusion 8 is 3.3 V. In this case, there is no output.

In the reset period, the voltage of the transfer gate 4 is 1.5 V; the voltage of the reset gate 9 changes from 0.0 V to 3.3

V; and the voltage of the selection gate is 0.0 V. In this case, the potential of the floating diffusion 8 also remains 3.3 V. With the reset operation in the reset period, the electric charge in the floating diffusion 8 is discharged and the potential of the floating diffusion 8 returns to the initial value.

In the batch transfer period and the reset period, the potential of the N⁻ diffusion layer 11 configuring the OFD path is lower than the potential of the transfer gate 4. In case that overflow charge is generated with an entrance of an extremely intense light, the excessive electric charge overflowed from the storage well 2 flows into the overflow drain region OFD, via the N⁻ diffusion layer 11, to be discharged, without flowing into the transfer transistor-forming region TT.

In the noise and signal components read-out period, for the first purpose of reading out the noise component, the voltage of the transfer gate 4 is set to 1.5 V; and the voltage of the reset gate 9 is set to 0.0 V. Further, by applying a voltage of 3.3 V to the selection gate of the selection transistor TS, the output of the amplifying transistor TA is outputted.

Then, the voltage of the transfer gate 4 changes from 1.5 V to 3.3 V; the voltage of the reset gate 9 changes from 3.3 V to 1.0 V; and the voltage of the selection gate is set to 0.0 V. Thus, electric charge is transferred from the impurity region 6 to the floating diffusion 8, which makes the potential of the floating diffusion 8 smaller than 3.3 V.

Next, for the purpose of reading out the signal component, the voltage of the transfer gate 4 is set to 1.5 V; the voltage of the reset gate 9 is set to 0.0 V; and a voltage of 3.3 V is applied to the selection gate. Thus, an output based on the potential of the floating diffusion 8 is outputted from the amplifying transistor TA. The output is outputted via the selection transistor TS.

After that, the voltage of the transfer gate 4 becomes 1.5 V; and the voltages of the reset gate 9 and the selection gate become 0.0 V. The floating diffusion 8 is reset when a voltage of 3.3 V is applied to the reset gate.

As described above, in the first embodiment, the excessive electric charge is discharged by providing the OFD path and the overflow drain region OFD adjoining to the storage well in the photodiode-forming region. By this method, even in the case of achieving both the global electronic shutter function for storing and transferring electric charge of all pixels at a time at the receipt of light and the CDS function based on advance noise read-out by providing a transfer gate between a photodiode-forming region and a reset transistor-forming region, the discharge of excessive electric charge becomes possible. Therefore, as a result, an image signal having high image quality can be obtained with the solid-state imaging device according to the first embodiment.

Figure 6:
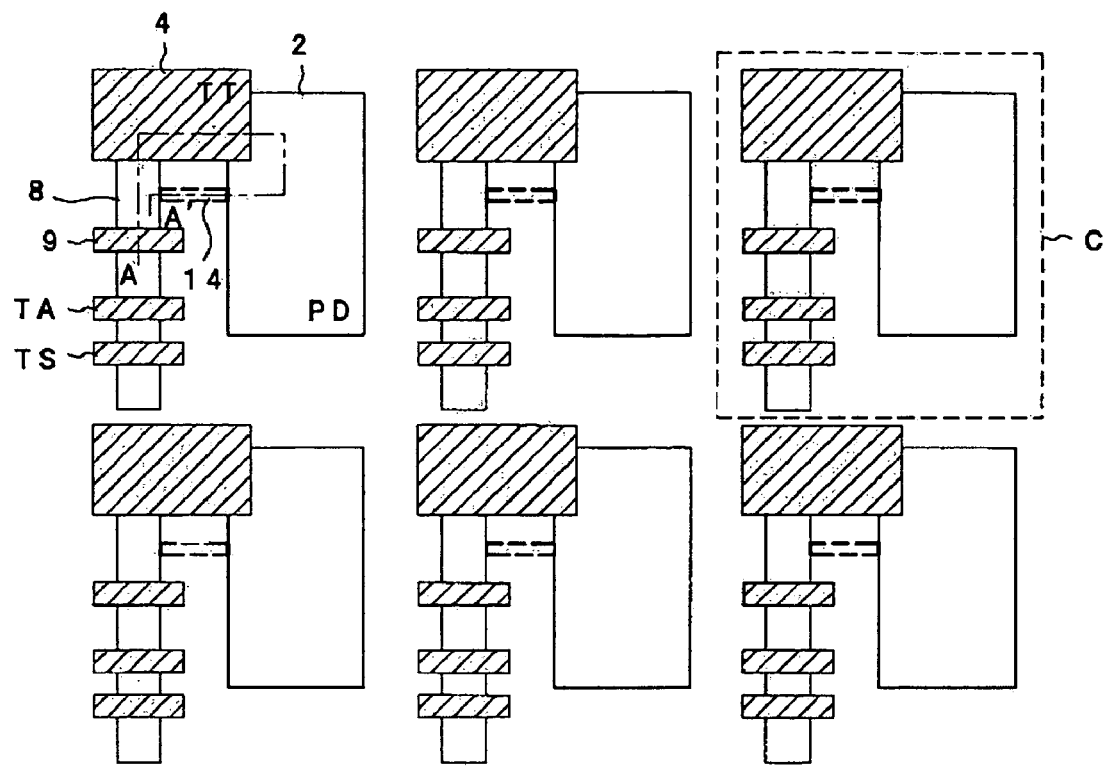
FIG. 6 is a plan view showing the plan-view shape of a solid state imaging device according to a second embodiment of the invention.
Figure 7:
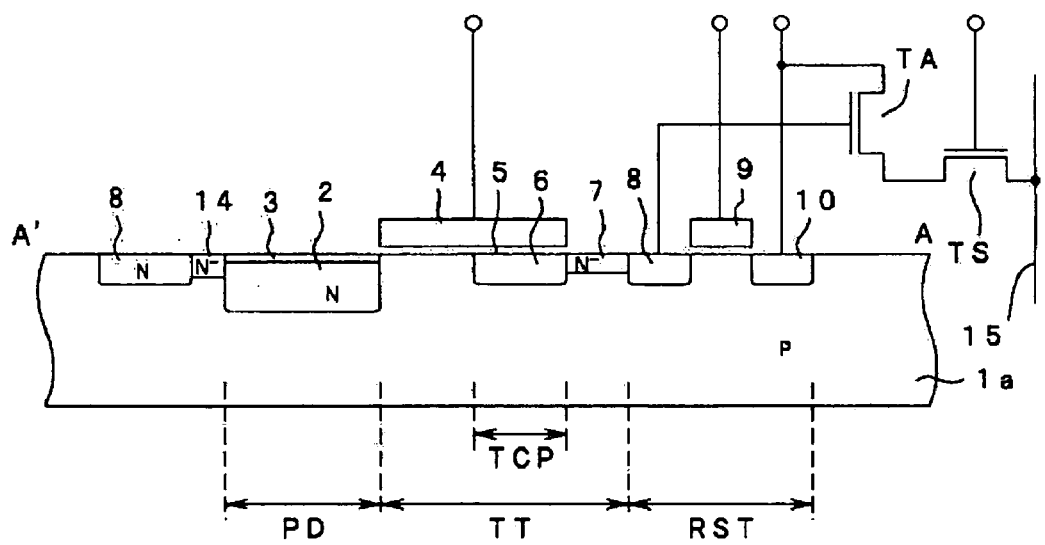
FIG. 7 is an explanatory diagram showing the cross section taken along the line A-A' in FIG. 6.

FIG. 6 is a plan view showing the plan-view shape of a solid-state imaging device according to a second embodiment of the invention. Further, FIG. 7 is an explanatory diagram showing the cross section taken along the line A-A' in FIG. 6.

The second embodiment is configured by deleting the overflow drain region OFD in FIG. 1 and forming an OFD path 14 instead of the N⁻ diffusion layer 11.

In the second embodiment, the floating diffusion 8 configuring the reset transistor also functions as an overflow drain for discharging the overflowed electric charge (excessive charge) of the light-generated charge generated in the photodiode-forming region PD. In the second embodiment, the OFD path 14 for transferring the excessive electric charge is formed between the photodiode-forming region PD and the floating diffusion 8 in the reset transistor-forming region RST.

That is, as shown in FIG. 1, the storage well 2 has part of one edge facing the floating diffusion 8. As shown in FIG. 7, the OFD path 14 based on N⁻ diffusion is formed in the above part on the substrate surface between the storage well 2 and the floating diffusion 8. The OFD path 14 has a lower potential, except in the transfer mode, compared to the other edges of the storage well 2. Therefore, the excessive electric charge from the photodiode-forming region PD flows into the floating diffusion 8, without flowing into the transfer transistor-forming region TT.

With the reset operation in the reset period, the electric charge in the floating diffusion 8 is discharged. In the second embodiment, the excessive electric charge flowed into the floating diffusion 8 via the OFD path 14 is also discharged during the reset period.

The other configurations are the same as those of the first embodiment. Further, the drive sequence, the variation in potential in each mode, etc. in the second embodiment are also the same as in the first embodiment. That is, if an extremely intense light enters into the photodiode and a large amount of light-generated charge exceeding the capacity of the photodiode-forming region PD is generated in the storage mode or the batch transfer mode, the overflow charge (excessive charge) from the photodiode-forming region PD is transferred to and stored in the floating diffusion 8 via the OFD path 14.

In the horizontal blanking period, a reset operation for noise read-out is performed first. In the reset period, the excessive electric charge flowed into the floating diffusion 8 of each pixel is discharged.

The other reactions are the same as in the first embodiment.

As described above, in the second embodiment, the excessive charge-discharging path is formed between the storage well of the photodiode-forming region and the floating diffusion of the reset transistor-forming region. By this method, even in the case of achieving both the global electronic shutter function for storing and transferring electric charge of all pixels at a time at the receipt of light and the CDS function based on advance noise read-out by providing a transfer gate between a photodiode-forming region and a reset transistor-forming region, the discharge of excessive electric charge becomes possible. Moreover, in the second embodiment, since the excessive electric charge is discharged by adding the overflow drain function to the floating diffusion of the reset transistor-forming region, there is no need to newly provide an overflow drain region only if a diffusion layer configuring the excessive charge-discharging path is formed. Therefore, the occupied area can be reduced. In addition, since there is no need to place the overflow drain region close to the photodiode-forming region, the flexibility in the profile design of parts including the photodiode-forming region can be improved.

Therefore, as a result, an image signal having high image quality can be obtained with the solid-state imaging device according to the second embodiment.

Figure 8:
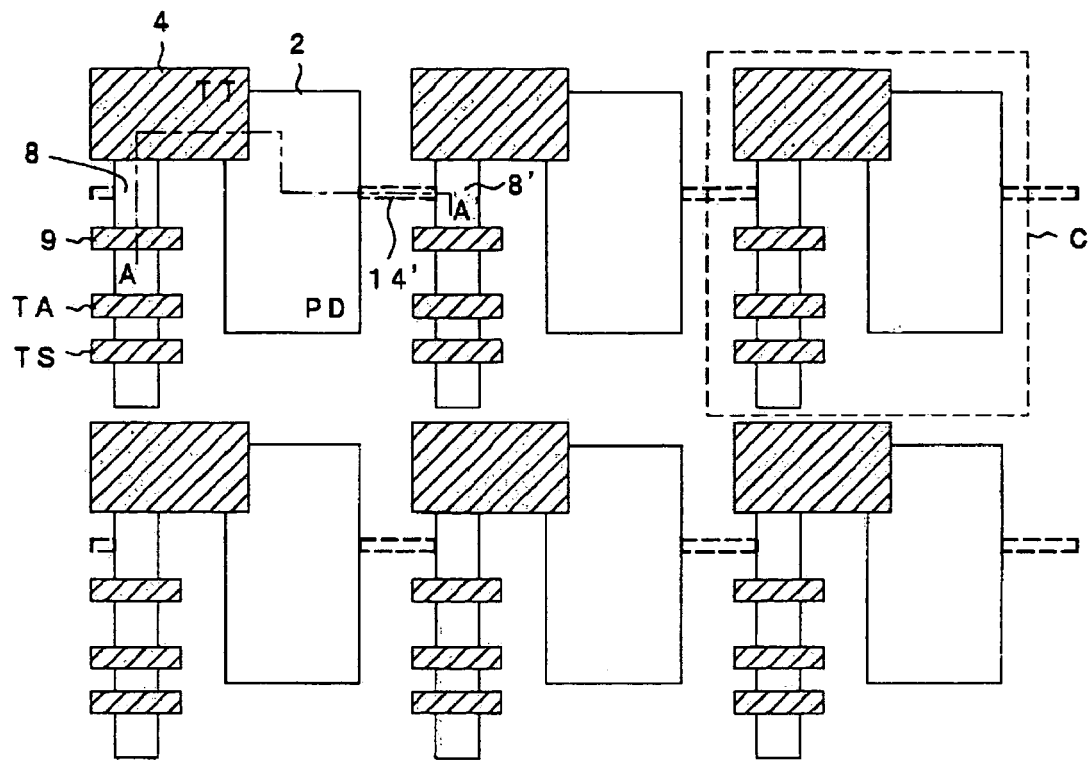
FIG. 8 is a plan view showing the plan-view shape of a solid state imaging device according to a third embodiment of the invention.
Figure 9:
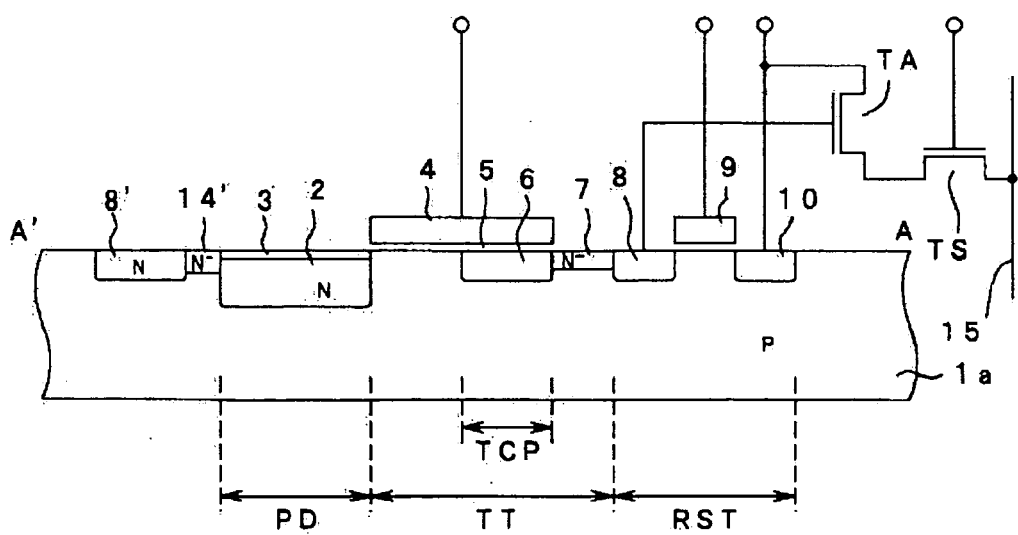
FIG. 9 is an explanatory diagram showing the cross section taken along the line A-A' in FIG. 8.

FIG. 8 is a plan view showing the plan-view shape of a solid-state imaging device according to a third embodiment of the invention. Further, FIG. 9 is an explanatory diagram showing the cross section taken along the line A-A' in FIG. 8.

The storage well 2 configuring the photodiode-forming region PD is also adjoining to a floating diffusion 8' included in the reset transistor-forming region of an adjoining pixel in the same line. In the third embodiment, an OFD path 14' based on N⁻ diffusion is formed in the above adjoining part on the substrate surface between the storage well 2 and the floating diffusion 8'. The excessive charge-discharging path 14' has a lower potential, except in the transfer mode, compared to the other edges of the storage well 2. Therefore, the excessive electric charge from the photodiode-forming region PD flows into the floating diffusion 8' of an adjoining pixel, without flowing into the transfer transistor-forming region TT.

The other configurations are the same as those of the second embodiment. Further, the drive sequence, the variation in potential in each mode, etc. in the second embodiment are also the same as in the second embodiment. That is, if an extremely intense light enters into the photodiode and a large amount of light-generated charge exceeding the capacity of the photodiode-forming region PD is generated in the storage mode or the batch transfer mode, the overflow charge (excessive charge) from the photodiode-forming region PD is transferred to and stored in the floating diffusion 8' of an adjoining pixel via the OFD path 14'.

Each of the operations of setting, resetting, noise read-out, and signal read-out is performed at a time for the pixels included in the same line during the horizontal blanking period. Therefore, the excessive electric charge flowed into the floating diffusions 8' of the pixels is discharged at a time during the reset period included in the horizontal blanking period.

The other reactions and effects are the same as in the second embodiment.

The invention is not limited to the above embodiments but can be changed, modified, etc. within the scope of the invention.

What is claimed is:

1. A solid-state imaging device, comprising:
    a substrate;
    a photoelectric transducer that is provided within the substrate and generates light-generated charge in accordance with incident light;
    a floating diffusion that retains the light-generated charge generated from the photoelectric transducer;
    a transfer and retention unit that is provided between the photoelectric transducer and the floating diffusion for a purpose of controlling a transfer of the light-generated charge and has a charge-retaining region that can retain the light-generated charge generated from the photoelectric transducer;
    a reset unit that initializes a potential of the floating diffusion;
    an amplifying transistor that generates an output based on a potential of the floating diffusion;
    a selection transistor that selectively outputs an output of the amplifying transistor; and
    an excessive charge-discharging path that lets excessive electric charge generated from the photoelectric transducer flow into the floating diffusion;
    wherein the photoelectric transducer includes:
    a second impurity region;
    wherein the floating diffusion includes:
    a fourth impurity region;
    wherein the excessive charge-discharging path includes:
    a fifth impurity region, which is formed on a surface of the substrate, contacting with the second impurity region and the fourth impurity region.

2. A solid-state imaging device, comprising:
    a substrate; and
    a sensor cell array including matrixed sensor cells, each of which has a photoelectric transducer, a floating diffusion, a transfer and retention unit, a reset unit, a amplifying transistor, a selection transistor, and an excessive charge-discharging path that are provided on the substrate,
    wherein the excessive charge-discharging path lets excessive electric charge that is generated from the photoelectric transducer flow into the floating diffusion in a same sensor cell;
    wherein the photoelectric transducer includes:
    a second impurity region;
    wherein the floating diffusion includes:
    a fourth impurity region;
    wherein the excessive charge-discharging path includes:
    a fifth impurity region, which is formed on a surface of the substrate, contacting with the second impurity region and the fourth impurity region.

* * * * *